(12) United States Patent
Matsubara

(10) Patent No.: US 7,233,535 B2
(45) Date of Patent: Jun. 19, 2007

(54) SEMICONDUCTOR MEMORY DEVICE

(75) Inventor: Yasushi Matsubara, Tokyo (JP)

(73) Assignee: Elpida Memory, Inc. (JP)

( * ) Notice: Subject to any disclaimer, the term of this patent is extended or adjusted under 35 U.S.C. 154(b) by 0 days.

(21) Appl. No.: 11/315,698

(22) Filed: Dec. 22, 2005

(65) Prior Publication Data

US 2006/0140029 A1   Jun. 29, 2006

(30) Foreign Application Priority Data

Dec. 27, 2004   (JP) .............................. 2004-376891

(51) Int. Cl.
*G11C 7/00* (2006.01)
(52) U.S. Cl. .................. 365/200; 365/189.07; 365/194
(58) Field of Classification Search .................. 365/200
See application file for complete search history.

(56) References Cited

U.S. PATENT DOCUMENTS 6,490,210 B2 *  12/2002  Takase et al. ............... 365/201
7,099,208 B2 *   8/2006  Okuyama et al. ........... 365/200

FOREIGN PATENT DOCUMENTS

| JP | 2001035187 | 2/2001 |
| JP | 2002042486 | 2/2002 |
| JP | 2004013985 | 1/2004 |
| JP | 2004178674 | 6/2004 |

* cited by examiner

*Primary Examiner*—Son L. Mai
(74) *Attorney, Agent, or Firm*—Hayes Soloway P.C.

(57) ABSTRACT

A redundancy replacement judging circuit includes a redundancy replacement judging circuit chain and a pseudo redundancy replacement judging circuit chain substantially equal in delay time to the redundancy replacement judging circuit chain. In response to an output of the pseudo redundancy replacement judging circuit chain, the redundancy replacement judging circuit outputs a redundancy judgment result of the redundancy replacement judging circuit chain. A semiconductor memory device includes the redundancy replacement judging circuit.

10 Claims, 2 Drawing Sheets

SEMICONDUCTOR MEMORY DEVICE

This application claims priority to prior Japanese patent application JP 2004-376891, the disclosure of which is incorporated herein by reference.

BACKGROUND OF THE INVENTION

This invention relates to a semiconductor memory device and, in particular, to a semiconductor memory device having a redundancy circuit.

In recent years, a semiconductor element is miniaturized and a semiconductor device is increased in scale. In particular, such trend is prominent in the field of a semiconductor memory device. For example, in a dynamic random access memory (DRAM), a product having a memory capacity of 1 Gbit is developed and put into practical use.

Such semiconductor memory device has a main memory cell array region in which a normal memory cell array is arranged and a relieving redundancy memory cell array region in which a spare memory cell array is arranged. The semiconductor memory device is provided with a redundancy circuit for replacing, in case where a defective memory is found at a part of the main memory cell array region, the defective memory by a redundancy memory cell. By the use of the redundancy circuit, the semiconductor memory device having a large scale is improved in yield and lowered in cost.

The redundancy circuit comprises a redundancy memory cell array section and a redundancy replacement judging circuit for judging whether or not the defective memory is replaced by the redundancy memory cell. The redundancy replacement judging circuit comprises a fuse section storing an address of the defective memory in the main memory cell array, a fuse judging circuit for comparing the address programmed in the fuse section and an input address and judging coincidence or incoincidence between these addresses to produce a judgment result, a logic section for carrying out logical operation upon the judgment result, and an output section.

When the input address is coincident with the address programmed in the fuse section, the redundancy circuit judges that the defective memory is replaced by the redundancy memory cell. Then, access to a memory cell in the main memory cell array region is inhibited. Instead, the redundancy memory cell in the redundancy memory cell array region is accessed and a reading or a writing operation is performed. On the other hand, if the input address is not coincident with the address stored in the fuse section, no replacement is carried out. Then, a memory cell in the main memory cell array region is accessed and a reading or a writing operation is performed.

For the redundancy circuit, various improvements have been made. For example, Japanese Unexamined Patent Application Publication (JP-A) No. 2001-35187 discloses a semiconductor memory and a redundancy relieving method thereof. According to the technique disclosed in the publication, in a probe inspection preceding redundancy relief, a pseudo relief information circuit is supplied with a defect address upon detection of a defect in a normal memory cell and a redundancy cell is selected. In this manner, a pseudo relieved state equivalent to a relieved state is tested so that the number of times of probe tests is reduced. Japanese Unexamined Patent Application Publication (JP-A) No. 2002-42486 discloses a semiconductor memory in which an internal power source voltage generating circuit is enhanced in current supply ability only upon programming a fuse. Thus, it is attempted to efficiently save current consumption.

Japanese Unexamined Patent Application Publication (JP-A) No. 2004-13985 discloses a semiconductor storage device provided with a redundancy function and a method of reducing current consumption therein. Specifically, the current consumption is reduced by inhibiting precharge of a bit line connected to a memory cell judged defective and an unused redundancy cell. Japanese Unexamined Patent Application Publication (JP-A) No. 2004-178674 discloses a semiconductor memory using an inexpensive tester having no FAM (Fail Address Map). The semiconductor memory comprises a built-in comparator circuit for comparing data from a memory cell and an expected value supplied from the tester so that a defective cell is detected and relieved.

On the other hand, the semiconductor memory device is required to have a higher operation frequency following an increase in operation speed of a CPU or the like. In order to achieve a higher data transfer speed, the redundancy circuit must have a higher operation speed. In particular, the redundancy replacement judging circuit of the redundancy circuit must be increased in operation speed.

Referring to FIGS. 1 and 2, description will be made of a related redundancy replacement judging circuit. As illustrated in FIG. 1, the redundancy replacement judging circuit comprises first through m-th fuse judging circuit groups 1 to m. The first through the m-th fuse judging circuit groups 1 to m comprise fuse judging circuits (11 to 1n, 21 to 2n, . . . , m1 to mn) having fuses, respectively. Each of the fuse judging circuits is supplied with a fuse judgment start signal and produces a fuse judgment signal. The fuse judgment signals are supplied to first through m-th NOR circuits 201 to 20m corresponding to the first through the m-th fuse judging circuit groups 1 to m, respectively. Each of the first through the m-th NOR circuits 201 to 20m produces a fuse group judgment signal.

The fuse group judgment signals from the first through the m-th NOR circuits 201 to 20m are supplied to an OR circuit 30. The OR circuit 30 produces a redundancy replacement judgment signal which is delivered to a judgment result release circuit 70. The judgment result release circuit 70 produces a redundancy enable signal (which may also be called a redundancy judgment signal). The fuse judgment start signal is supplied from a judgment control circuit 80 to each of the fuse judging circuits and to an inverter delay circuit 90. The inverter delay circuit 90 delays the fuse judgment start signal to produce a delayed fuse judgment start signal which is supplied to the judgment result release circuit 70.

Next, an operation of the redundancy replacement judging circuit will be described. Each of the fuse judging circuits is supplied with the fuse judgment start signal from the judgment control circuit 80 and judges coincidence or incoincidence between fuse programmed information and input information. Each of the fuse judging circuits (11 to 1n, 21 to 2n, . . . , m1 to mn) produces the fuse judgment signal having a low level and a high level upon coincidence and incoincidence between the programmed information in the fuse and the input information, respectively, and delivers the fuse judgment signal to a corresponding one of the first through the m-th NOR circuits 201 to 20m.

The fuse judgment signals produced by the fuse judging circuits 11 to 1n of the first fuse judging circuit group 1 are supplied to the first NOR circuit 201. Similarly, the fuse judgment signals produced by the fuse judging circuits k1 to kn of the k-th fuse judging circuit group k are supplied to the k-th NOR circuit 20k. The first through the m-th NOR circuits 201 to 20m produce the fuse group judgment signals, respectively.

For example, if the input information supplied to the first fuse judging circuit group 1 is entirely coincident with the programmed information in the fuses, all of the fuse judging circuits 11 to in produce the fuse judgment signals of a low level and the first NOR circuit 201 produces the phase group judgment signal of a high level. On the other hand, incoincidence is judged at any of the fuse judging circuits in each of the second through the m-th fuse judging circuit groups 2 to m. Therefore, the second through the m-th NOR circuits 202 to 20m produce the fuse group judgment signals of a low level.

If the fuse group judgment signal produced by the first fuse judging circuit group 1 has a high level, a memory cell array at an input address is replaced by a redundancy memory cell corresponding to the first fuse judging circuit group 1. On the other hand, if the fuse group judgment signal produced by the first fuse judging circuit group 1 has a low level, the memory cell array at the input address is not replaced by the redundancy memory cell array corresponding to the first fuse judging circuit group 1.

Further, the OR circuit 30 is supplied with the fuse judgment signals from the second through the m-th NOR circuits 202 to 20m and produces the redundancy replacement judgment signal. The redundancy replacement judgment signal is a judgment signal representing whether or not the memory cell array at the input address is replaced by the redundancy memory cell. If the memory cell array is replaced by the redundancy memory cell, the fuse group judgment signal of one of the second through the m-th NOR circuits 202 to 20m has a high level and the OR circuit 30 produces the redundancy replacement judgment signal of a high level.

Supplied with the redundancy replacement judgment signal, the judgment result release circuit 70 produces a redundancy enable signal in synchronism with the delayed fuse judgment start signal. When the redundancy enable signal has a high level, the memory cell array is replaced by the redundancy memory cell. Then, the redundancy enable signal inhibits access to the normal main memory cell array and allows access to the redundancy memory cell array. On the contrary, if the redundancy enable signal has a low level, the memory cell array is not replaced by the redundancy memory cell. The redundancy enable signal allows access to the normal main memory cell array and inhibits access to the redundancy memory cell array.

Referring to FIG. 2, waveforms of the above-mentioned signals are shown. Specifically, these waveforms represent the fuse judgment start signal (a), the fuse judgment signal (b), the fuse group judgment signal (c), the redundancy replacement judgment signal (d), the delayed fuse judgment start signal (e), and the redundancy enable signal (f).

At first, the fuse judgment start signal (a) is turned to a high level. Comparison between the programmed information in the fuse and the input information is carried out and judgment is made. The fuse judgment signals (b) from the fuse judging circuits 11 to mn are supplied to the NOR circuits 201 to 20m corresponding to the respective fuse judging circuit groups. The NOR circuits 201 to 20m delivers the fuse group judgment signals (c) for the fuse judging circuit groups 1 to m to the OR circuit 30. The OR circuit 30 delivers the redundancy replacement judgment signal (d) to the judgment result release circuit 70.

The judgment result release circuit 70 is also supplied with the delayed fuse judgment start signal (e) and produces the redundancy enable signal (f) which is sent to an internal circuit (not shown). Thus, the internal circuit is controlled so as to operate the redundancy memory cell or the normal main memory cell array.

Herein, the delayed fuse judgment start signal has a delay time td which is determined by including a delay (or a delay time) of the fuse judgment start signal at the logic circuits and an operation margin $\Delta t$ at the judgment result release circuit 70. The delay (or the delay time) td is very large and inhibits a high speed operation of the semiconductor memory device.

The reason will be described. The redundancy replacement judging circuit requires large current consumption during operation and transitional noise is generated at a power source and a GND line disposed near the redundancy replacement judging circuit. Further, a processing time from the input of the judgment start signal into the fuse judging circuit to the output of the judgment result and a processing time from the input of the judgment result into the logic circuits to the output of the result of logical operation are affected by the noise at the power supply and the GND line and depend upon a power source voltage and a temperature.

In case where the redundancy enable signal is released to an inside of a chip after the output of the logic circuit is produced, the inverter delay circuit 90 is provided to delay the release of the redundancy enable signal until an arrival time of the output of the logic circuit. This is because, if the release of the redundancy enable signal is performed before arrival of the output of the logic circuit in an output section of the judgment result release circuit 70, an error is released. In this case, because of the influence of the noise at the power source and the GND line as well as the dependency upon the power source voltage and the temperature, the delay time must include a wide margin in order to assure a sufficient waiting time during which the release is delayed by the inverter delay circuit. As a consequence, the time instant when the redundancy judgment result is released to the inside of the chip is delayed so that a high-speed access operation is inhibited.

As described above, the time instant when the redundancy judgment result (redundancy enable signal) is released to the inside of the chip is delayed so that a high-speed access operation is inhibited. In view of the above, it is desired to release the redundancy judgment result to the inside of the chip as fast as possible. However, the above-referenced publications merely propose an increase in efficiency of the redundancy circuit and a reduction in current consumption and do not mention an increase in operation speed of the redundancy circuit.

SUMMARY OF THE INVENTION

It is therefore an object of this invention to provide a redundancy replacement judging circuit which is capable of releasing a redundancy judgment result to the inside of a chip at a high speed by providing a pseudo circuit having a delay equivalent to that of a fuse judgment signal and by producing a redundancy enable signal in response to a release signal from the pseudo circuit and to provide a semiconductor memory comprising the redundancy replacement judging circuit.

Semiconductor memory devices according to this invention and redundancy replacement judging circuits according to this invention are as follows:

(1) A semiconductor memory device comprising a redundancy replacement judging circuit, wherein the redundancy replacement judging circuit comprises a redundancy replacement judging circuit chain and a pseudo redundancy replacement judging circuit chain substantially equal in delay time to the redundancy replacement judging circuit chain, the redundancy replacement judging circuit being for producing a redundancy judgment result of the redundancy replacement judging circuit chain in response to an output of the pseudo redundancy replacement judging circuit chain.

(2) A semiconductor memory device as described in (1), wherein the redundancy replacement judging circuit chain and the pseudo redundancy replacement judging circuit chain comprise equivalent circuits substantially equal in delay time to each other.

(3) A semiconductor memory device as described in (1), wherein the redundancy replacement judging circuit chain comprises a fuse judging circuit, a first logic circuit, and a second logic circuit, the pseudo redundancy replacement judging circuit chain comprising a pseudo fuse judging circuit, a first pseudo logic circuit, and a second pseudo logic circuit.

(4) A semiconductor memory device as described in (3), wherein each of the first logic circuit and the first pseudo logic circuit is a NOR circuit, each of the second logic circuit and the second pseudo logic circuit being an OR circuit.

(5) A semiconductor memory device as described in (1), wherein the pseudo redundancy replacement judging circuit chain is disposed in the vicinity of the redundancy replacement judging circuit chain.

(6) A semiconductor memory device as described in (5), wherein a signal wiring of the pseudo redundancy replacement judging circuit chain is formed by a material, a line interval, a line width, and a wiring length same as those of the redundancy replacement judging circuit chain.

(7) A semiconductor memory device comprising a redundancy replacement judging circuit, wherein the redundancy replacement judging circuit comprises a redundancy replacement judging circuit chain responsive to a fuse judgment start signal for comparing fuse programmed information and input information to produce a redundancy replacement judgment signal, a pseudo redundancy replacement judging circuit chain for producing a pseudo redundancy replacement judgment release signal at a delay time substantially equal to that of the redundancy replacement judgment signal, and a judgment result release circuit for outputting, as a redundancy judgment signal, the redundancy replacement judgment signal in response to the pseudo redundancy replacement judgment release signal.

(8) A redundancy replacement judging circuit comprising a redundancy replacement judging circuit chain, a pseudo redundancy replacement judging circuit chain substantially equal in delay time to the redundancy replacement judging circuit chain, and a judgment result release circuit for producing a redundancy judgment result of the redundancy replacement judging circuit chain in response to an output of the pseudo redundancy replacement judging circuit chain.

(9) A redundancy replacement judging circuit as described in (8), wherein the redundancy replacement judging circuit chain and the pseudo redundancy replacement judging circuit chain comprise equivalent circuits substantially equal in delay time to each other.

(10) A redundancy replacement judging circuit comprising a redundancy replacement judging circuit chain responsive to a fuse judgment start signal for comparing fuse programmed information and input information to produce a redundancy replacement judgment signal, a pseudo redundancy replacement judging circuit chain for producing a pseudo redundancy replacement judgment release signal at a delay time substantially equal to that of the redundancy replacement judgment signal, and a judgment result release circuit for outputting, as a redundancy judgment signal, the redundancy replacement judgment signal in response to the pseudo redundancy replacement judgment release signal.

In this invention, the redundancy replacement judging circuit comprises the redundancy replacement judging circuit chain having the fuse judging circuit, the first logic circuit, and the second logic circuit, the pseudo redundancy replacement judging circuit chain having the pseudo fuse judging circuit, the first pseudo logic circuit, and the second pseudo logic circuit, and the judgment result release circuit. The redundancy replacement judgment signal from the redundancy replacement judging circuit chain is outputted as the redundancy judgment signal in response to the pseudo redundancy replacement judgment release signal from the pseudo redundancy judging circuit chain.

The pseudo redundancy replacement judging circuit chain is used as a pseudo structure for the redundancy replacement judging circuit chain. Thus, the pseudo redundancy replacement judgment release signal is obtained at a substantially same time instant as a time instant when the redundancy replacement judgment signal is obtained. As a result, the redundancy judgment result can be generated in response to the pseudo redundancy replacement judgment release signal at a substantially same time instant as a time instant when the redundancy replacement judgment signal is determined by the redundancy replacement judgment signal. Thus, it is possible to release the redundancy judgment result in a shortest time.

According to this invention, it is possible to obtain a redundancy replacement judging circuit capable of obtaining a redundancy judgment result in a shortest time so as to be operable at a high speed and to obtain a semiconductor memory device comprising the redundancy replacement judging circuit.

DESCRIPTION OF THE PREFERRED EMBODIMENT

This invention relates to a semiconductor memory device comprising a redundancy circuit and, in particular, to a redundancy replacement judging circuit for judging whether the redundancy circuit is used or unused. More specifically, this invention relates to a technique effectively applied to a redundancy replacement judgment signal generating section comprising, as a fundamental component, a fuse judging circuit mounted to a synchronous DRAM. The redundancy replacement judging circuit of the semiconductor memory device in this invention has a redundancy replacement judging circuit chain and a pseudo redundancy replacement judging circuit chain similar in circuit structure to the redundancy replacement judging circuit chain. An output of the pseudo redundancy replacement judging circuit chain is used as a release signal for a redundancy judgment result (redundancy enable signal).

The redundancy replacement judging circuit chain comprises a fuse judging circuit, a first logic circuit, and a second logic circuit. In response to a fuse judgment start signal, the fuse judging circuit compares fuse programmed information and input information and produces a judgment result. The judgment result is supplied to the logic circuits and subjected to logical operation to produce a logical operation result. The logical operation result is delivered to a judgment result release circuit as a redundancy replacement judgment signal. The pseudo redundancy replacement judging circuit chain comprises a pseudo fuse judging circuit, a first pseudo logic circuit, and a second pseudo logic circuit. In response to the fuse judgment start signal, the pseudo fuse judging circuit carries out comparison and produces a judgment result. The judgment result is supplied to the pseudo logic circuits and subjected to logical operation to produce a logical operation result. The logical operation result is delivered to the judgment result release circuit as a pseudo redundancy replacement judgment release signal. In response to the pseudo redundancy replacement judgment release signal from the pseudo redundancy replacement judging circuit chain, the judgment result release circuit outputs, as a redundancy enable signal, the redundancy replacement judgment signal from the redundancy replacement judging circuit chain.

With the above-mentioned structure, the redundancy replacement judging circuit capable of releasing the redundancy judgment result to the inside of a chip in a shortest time and a semiconductor memory device comprising the redundancy replacement judging circuit are obtained.

Figure 1:
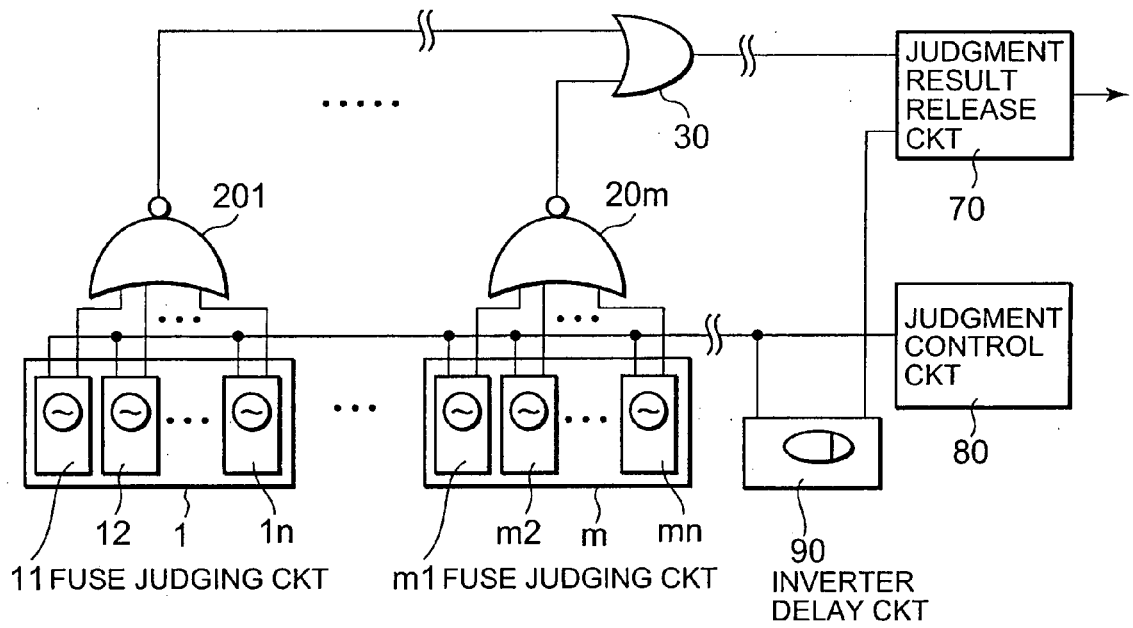
FIG. 1 is a block diagram of a related existing redundancy replacement judging circuit.
Figure 2:
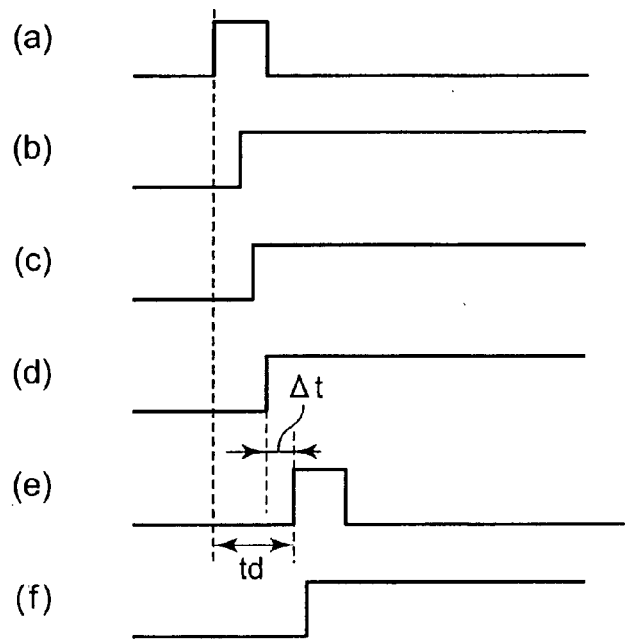
FIG. 2 is a view showing operation waveforms of the redundancy replacement judging circuit illustrated in FIG. 1.
Figure 3:
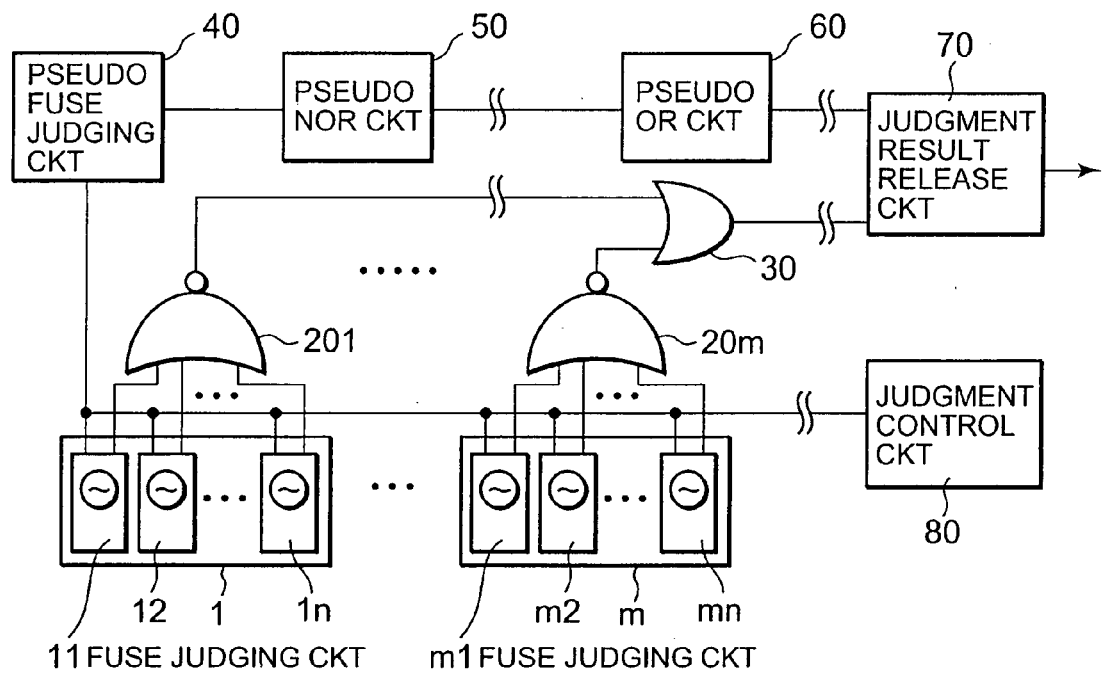
FIG. 3 is a block diagram of a redundancy replacement judging circuit according to an embodiment of this invention.
Figure 4:
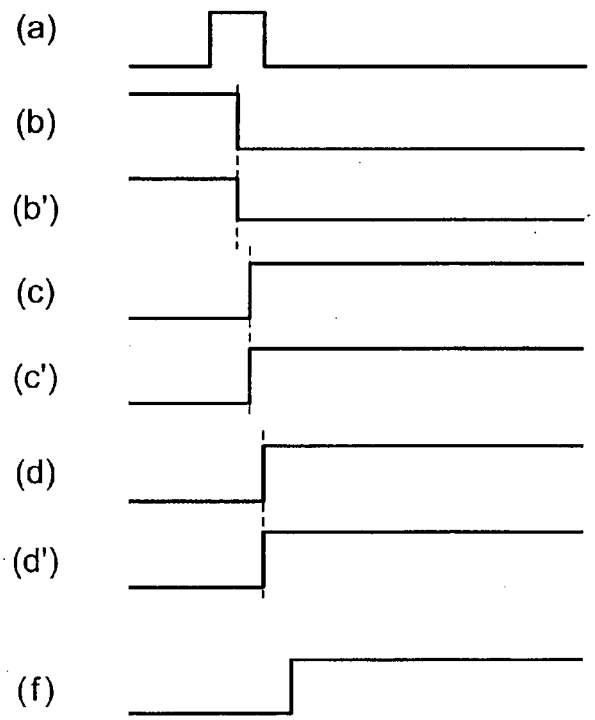
FIG. 4 is a view showing operation waveforms of the redundancy replacement judging circuit illustrated in FIG. 3.

Referring to FIGS. 3 and 4, a redundancy replacement judging circuit according to an embodiment of this invention will be described.

As illustrated in FIG. 3, the redundancy replacement judging circuit comprises first through m-th fuse judging circuit groups (1 to m). Each of the first through the m-th fuse judging circuit groups (1 to m) comprises first through n-th fuse judging circuits (11 to 1n, 21 to 2n, . . . , m1 to mn) and a NOR circuit (a first logic circuit) (201 to 20m). The redundancy replacement judging circuit further comprises an OR circuit (a second logic circuit) 30, a pseudo fuse judging circuit 40, a pseudo NOR circuit (a first pseudo logic circuit) 50, a pseudo OR circuit (a second pseudo logic circuit) 60, a judgment result release circuit 70, and a judgment control circuit 80.

The judgment control circuit 80 produces a fuse judgment start signal which is supplied to the fuse judging circuits (11 to 1n, . . . , m1 to mn) and the pseudo fuse judging circuit 40. The first through the n-th fuse judging circuits are arranged in an array and form each of the fuse judging circuit groups (1 to m). In each of the fuse judging circuit groups having the first through the n-th fuse judging circuits, one row or column of a normal memory cell array can be replaced by one row or column of a redundancy memory cell array according to the programmed information in n fuses. In this embodiment, m rows or columns of the normal memory cell array can be replaced by m rows or columns of the redundancy memory cell array by provision of the first through the m-th fuse judging circuit groups.

Each of the fuse judging circuit groups 1 to m comprises the first through the n-th fuse judging circuits and the NOR circuit. For example, the first fuse judging circuit group 1 comprises the first through the n-th fuse judging circuits 11 to 1n each of which has a fuse, and the NOR circuit 201. In response to the fuse judgment start signal, each of the first through the n-th fuse judging circuits 11 to 1n produces a fuse judgment signal representative of coincidence or incoincidence between the programmed information in the fuse and input information. The NOR circuit 201 is supplied with the fuse judgment signals, n in number, from the first through the n-th fuse judging circuits 11 to 1n and judges coincidence or incoincidence among all of the fuse judgment signals to produce a fuse group judgment signal to the OR circuit 30.

Upon coincidence among all of the fuse judgment signals, a particular memory cell array at an address of the input information is replaced by the redundancy memory cell array (or a redundancy circuit) corresponding to the fuse judging circuit group in consideration. Upon incoincidence of at least one of the fuse judging signals, a particular memory cell array at an address of the input information is not replaced by the redundancy circuit (the redundancy memory cell array) corresponding to the fuse judging circuit group in consideration.

The OR circuit 30 is supplied with the fuse group judgment signals from the first through the m-th fuse judging circuit groups 1 to m and judges whether or not any of the fuse judging circuit groups produces a flag indicating the use of the redundancy circuit (the redundancy memory cell array). As a result of judgment, the OR circuit 30 produces a redundancy replacement judgment signal to the judgment result release circuit 70. For example, if the k-th fuse judging circuit group k produces a high level while the remaining fuse judging circuit groups produce a low level, the OR circuit 30 produces a redundancy replacement judgment signal of a high level. If all of the fuse judging circuit groups produce a low level, the OR circuit 30 produces a redundancy replacement judgment signal of a low level. Thus, the OR circuit 30 delivers to the judgment result release circuit 70 the redundancy replacement judgment signal indicative of whether or not any of the fuse judging circuit groups indicates the use of the redundancy circuit (the redundancy memory cell array).

In response to the fuse judgment start signal from the judgment control circuit 80, the pseudo fuse judging circuit 40 delivers a pseudo fuse judgment release signal of a low level to the pseudo NOR circuit 50. The pseudo NOR circuit 50 delivers a pseudo fuse group judgment release signal of a high level to the pseudo OR circuit 60. The pseudo OR circuit 60 is supplied with the pseudo fuse group judgment release signal from the pseudo NOR circuit 50 and delivers a pseudo redundancy replacement judgment release signal of a high level to the judgment result release circuit 70.

In response to the pseudo redundancy replacement judgment release signal, the judgment result release circuit 70 outputs, as a redundancy enable signal (redundancy judgment signal), the redundancy replacement judgment signal supplied thereto. If the redundancy replacement judgment signal has a high level, the judgment result release circuit 70 produces a high level, assuming that the normal memory cell array is replaced by the redundancy circuit (the redundancy memory cell array). If the redundancy replacement judgment signal has a low level, the judgment result release circuit 70 produces a low level, assuming that the normal memory cell array is not replaced by the redundancy circuit (the redundancy memory cell array).

A combination of the fuse judging circuits (11 to mn), the NOR circuits (201 to 20m), and the OR circuit (30) is called a redundancy replacement judging circuit chain. A combination of the pseudo fuse judging circuits 40, the pseudo NOR circuits 50, and the pseudo OR circuit 60 is called a pseudo redundancy replacement judging circuit chain. The pseudo redundancy replacement judging circuit chain is a pseudo circuit equivalent to the redundancy replacement judging circuit chain and comprises transistors substantially same in number, logical structure, and transistor size as those of the redundancy replacement judging circuit chain. The pseudo redundancy replacement judging circuit chain is formed so that a delay time from an input to an output to and from the circuit chain is same between the redundancy replacement judging circuit chain and the pseudo redundancy replacement judging circuit chain.

Each circuit element of the pseudo redundancy replacement judging circuit chain is preferably located near a corresponding circuit element of the redundancy replacement judging circuit chain. Further, a signal wiring of the pseudo redundancy replacement judging circuit chain preferably has a structure formed by a same material with a same line space, a same line width, and a same wiring length. By such near location and such same structure, the redundancy replacement judging circuit chain and the pseudo redundancy replacement judging circuit chain exhibit same variation in chip temperature and power source voltage. Therefore, the delay time is equal between the redundancy replacement judging circuit chain and the pseudo redundancy replacement judging circuit chain.

With the above-mentioned structure, the fuse judgment signal and the pseudo fuse judgment release signal are substantially same in characteristic and delay time. The fuse group judgment signal and the pseudo fuse group judgment release signal are substantially same in characteristic and delay time. The redundancy replacement judgment signal and the pseudo redundancy replacement judgment release signal are substantially same in characteristic and delay time. Accordingly, the redundancy replacement judgment signal and the pseudo redundancy replacement judgment release signal are supplied to the judgment result release circuit 70 at a substantially same timing. Thus, with a minimum margin time from the arrival time instant of the redundancy replacement judgment signal, the judgment result release circuit 70 releases the redundancy enable signal.

Referring to FIG. 4 in addition, an operation of this embodiment will be described. At first, the judgment control circuit produces the fuse judgment start signal ((a) in FIG. 4) which is supplied to the fuse judging circuits and the pseudo fuse judging circuit simultaneously. As a consequence, the fuse judging circuits of the fuse judging circuit group produce the fuse judgment results as the fuse judgment signals ((b) in FIG. 4), respectively. At a substantially same time instant, the pseudo fuse judging circuit produces the pseudo fuse judgment release signal ((b') in FIG. 4) as an output signal.

The fuse judgment signals ((b) in FIG. 4) are supplied to the NOR circuit in each fuse judging circuit group and the NOR circuit produces a logical operation result as the fuse group judgment signal ((c) in FIG. 4). At a substantially same time instant, the pseudo NOR circuit is supplied with the pseudo fuse judgment release signal ((b') in FIG. 4) and produces the pseudo fuse group judgment release signal ((c') in FIG. 4). Similarly, the fuse group judgment signals ((c) in FIG. 4) are supplied to the OR circuit and the OR circuit produces a logical operation result as the redundancy replacement judgment signal ((d) in FIG. 4). At a substantially same time instant, the pseudo OR circuit is supplied with the pseudo fuse group judgment release signal ((c') in FIG. 4) from the pseudo NOR circuit and produces the pseudo redundancy replacement judgment release signal ((d') in FIG. 4).

As is obvious from the foregoing, the redundancy replacement judgment signal ((d) in FIG. 4) and the pseudo redundancy replacement judgment release signal ((d') in FIG. 4) arrive the judgment result release circuit 70 at a substantially same time instant. In the judgment result release circuit 70, the pseudo redundancy replacement judgment release signal ((d') in FIG. 4) is subjected to some time correction, for example, given a delay corresponding to two stages of inverters and used to release the redundancy replacement judgment signal ((d) in FIG. 4). After some delay, the judgment result release circuit 70 produces the redundancy enable signal ((f) in FIG. 4).

For example, it is assumed that the redundancy replacement judgment signal ((d) in FIG. 4) has a low level until a time instant when a delayed signal of the pseudo redundancy replacement judgment release signal ((d') in FIG. 4) forms an output of the judgment result release circuit 70, In this event, the redundancy enable signal ((f) in FIG. 4) as the output signal of the judgment result release circuit 70 has a low level which means incoincidence with a redundancy replacement address. That is, no replacement by the redundancy circuit (the redundancy memory cell array) takes place. On the contrary, if the redundancy replacement judgment signal ((d) in FIG. 4) has a high level at the above-mentioned time instant, the redundancy enable signal ((f) in FIG. 4) has a high level which means coincidence with the redundancy replacement address, That is, replacement by the redundancy circuit (the redundancy memory cell array) takes place.

In this embodiment, the first logic circuit supplied with the outputs of the fuse judging circuits comprises the NOR circuit and the second logic circuit supplied with the outputs of the NOR circuits comprises the OR circuit. However, the first and the second logic circuits are not limited to the NOR circuit and the OR circuit, respectively. The first logic circuit may comprise any logic circuit for judging and discriminating coincidence among the fuse judgment signals. The second logic circuit may comprise any logic circuit capable of discriminating that one of the outputs of the first logic circuits is coincident with the redundancy replacement address.

In this case, the pseudo NOR circuit 50 and the pseudo OR circuit 60 in the pseudo redundancy replacement judging circuit chain are similar in structure to the first and the second logic circuits in the redundancy replacement judging circuit chain. The pseudo redundancy replacement judgment release signal of the pseudo redundancy replacement judging circuit chain is a signal for releasing the redundancy replacement judgment signal. Therefore, the pseudo redundancy replacement judgment release signal is set to a logic level such that the redundancy replacement judgment signal is outputted from the judgment result release circuit.

According to this invention, there is provided a redundancy replacement judging circuit having a redundancy replacement judging circuit chain and a pseudo redundancy replacement judging circuit chain having a delay time substantially equal to that of the redundancy replacement judging circuit chain. In response to an output of the pseudo redundancy replacement judging circuit chain, a redundancy judgment result of the redundancy replacement judging circuit chain is outputted. Therefore, the redundancy replacement judging circuit is operable with a minimum margin. Further, this invention provides a semiconductor memory device having the redundancy replacement judging circuit.

Although this invention has been described in detail in conjunction with the preferred embodiment thereof, it will readily be understood that this invention is not limited to the foregoing embodiment but may be modified in various other manners without departing from the scope of this invention.

For example, in the foregoing embodiment, the fuse judgment start signal is produced from the judgment control circuit near the judgment result release circuit. Instead, a circuit for producing the start signal may be disposed near a farthest one of the fuse judging circuits in the fuse judging circuit group which is disposed farthest from the judgment result release circuit and the judgment result is returned in order from the farthest one.

Further, the number of circuits for logical operation of the fuse judging signals and the number of times of logical operation may be any desired number. The various pseudo circuits need not be exactly same in circuit structure to the corresponding base circuits but may be slightly modified as far as the equivalent delay time is achieved. For example, the number of stages of the logical circuits may be greater or smaller by one or two. The line width and the line pitch of the wiring for the pseudo signal may be slightly modified as far as the material of the wiring is same as that of the base signal. The wiring length may be slightly different within a range substantially equal to the wiring length for the base signal. In terms of numerical values, the line width, the line pitch, and the wiring length are deemed to be substantially equivalent as far as the numerical values fall within a range between 50% and 150%. Such variations are included in the range of this invention.

What is claimed is:

1. A semiconductor memory device comprising a redundancy replacement judging circuit, wherein said redundancy replacement judging circuit comprises a redundancy replacement judging circuit chain and a pseudo redundancy replacement judging circuit chain substantially equal in delay time to said redundancy replacement judging circuit chain, said redundancy replacement judging circuit being for producing a redundancy judgment result of said redundancy replacement judging circuit chain in response to an output of said pseudo redundancy replacement judging circuit chain.

2. A semiconductor memory device as claimed in claim 1, wherein said redundancy replacement judging circuit chain and said pseudo redundancy replacement judging circuit chain comprise equivalent circuits substantially equal in delay time to each other.

3. A semiconductor memory device as claimed in claim 1, wherein said redundancy replacement judging circuit chain comprises a fuse judging circuit, a first logic circuit, and a second logic circuit, said pseudo redundancy replacement judging circuit chain comprising a pseudo fuse judging circuit, a first pseudo logic circuit, and a second pseudo logic circuit.

4. A semiconductor memory device as claimed in claim 3, wherein each of said first logic circuit and said first pseudo logic circuit is a NOR circuit, each of said second logic circuit and said second pseudo logic circuit being an OR circuit.

5. A semiconductor memory device as claimed in claim 1, wherein said pseudo redundancy replacement judging circuit chain is disposed in the vicinity of said redundancy replacement judging circuit chain.

6. A semiconductor memory device as claimed in claim 5, wherein a signal wiring of said pseudo redundancy replacement judging circuit chain is formed by a material, a line interval, a line width, and a wiring length same as those of said redundancy replacement judging circuit chain.

7. A semiconductor memory device comprising a redundancy replacement judging circuit, wherein said redundancy replacement judging circuit comprises a redundancy replacement judging circuit chain responsive to a fuse judgment start signal for comparing fuse programmed information and input information to produce a redundancy replacement judgment signal, a pseudo redundancy replacement judging circuit chain for producing a pseudo redundancy replacement judgment release signal at a delay time substantially equal to that of said redundancy replacement judgment signal, and a judgment result release circuit for outputting, as a redundancy judgment signal, said redundancy replacement judgment signal in response to said pseudo redundancy replacement judgment release signal.

8. A redundancy replacement judging circuit comprising a redundancy replacement judging circuit chain, a pseudo redundancy replacement judging circuit chain substantially equal in delay time to said redundancy replacement judging circuit chain, and a judgment result release circuit for producing a redundancy judgment result of said redundancy replacement judging circuit chain in response to an output of said pseudo redundancy replacement judging circuit chain.

9. A redundancy replacement judging circuit as claimed in claim B, wherein said redundancy replacement judging circuit chain and said pseudo redundancy replacement judging circuit chain comprise equivalent circuits substantially equal in delay time to each other.

10. A redundancy replacement judging circuit comprising a redundancy replacement judging circuit chain responsive to a fuse judgment start signal for comparing fuse programmed information and input information to produce a redundancy replacement judgment signal, a pseudo redundancy replacement judging circuit chain for producing a pseudo redundancy replacement judgment release signal at a delay time substantially equal to that of said redundancy replacement judgment signal, and a judgment result release circuit for outputting, as a redundancy judgment signal, said redundancy replacement judgment signal in response to said pseudo redundancy replacement judgment release signal.

* * * * *

UNITED STATES PATENT AND TRADEMARK OFFICE
CERTIFICATE OF CORRECTION

| | | |
|---|---|---|
| PATENT NO. | : 7,233,535 B2 | Page 1 of 1 |
| APPLICATION NO. | : 11/315698 | |
| DATED | : June 19, 2007 | |
| INVENTOR(S) | : Matsubara | |

It is certified that error appears in the above-identified patent and that said Letters Patent is hereby corrected as shown below:

Claim 9, Col. 12, line 37, "in claim B," should be --in claim 8--.

Signed and Sealed this

Twenty-first Day of July, 2009

JOHN DOLL
*Acting Director of the United States Patent and Trademark Office*